United States Patent
Huang et al.

(10) Patent No.: US 10,979,066 B1
(45) Date of Patent: Apr. 13, 2021

(54) PIPELINED ANALOG-TO-DIGITAL CONVERTER HAVING INPUT SIGNAL PRE-COMPARISON AND CHARGE REDISTRIBUTION

(71) Applicant: NO.24 RESEARCH INSTITUTE OF CHINA ELECTRONICS TECHNOLOGY GROUP CORPORATION, Chongqing (CN)

(72) Inventors: Zhengbo Huang, Chongqing (CN); Ting Li, Chongqing (CN); Yong Zhang, Chongqing (CN); Ruzhang Li, Chongqing (CN); Guangbing Chen, Chongqing (CN); Yabo Ni, Chongqing (CN)

(73) Assignee: NO. 24 RESEARCH INSTITUTE OF CHINA ELECTRONICS TECHNOLOGY GROUP CORPORATION, Chongqing (CN)

( * ) Notice: Subject to any disclaimer, the term of this patent is extended or adjusted under 35 U.S.C. 154(b) by 72 days.

(21) Appl. No.: 16/497,806

(22) PCT Filed: Sep. 11, 2017

(86) PCT No.: PCT/CN2017/101184
§ 371 (c)(1),
(2) Date: Sep. 26, 2019

(87) PCT Pub. No.: WO2018/176739
PCT Pub. Date: Oct. 4, 2018

(30) Foreign Application Priority Data

Mar. 29, 2017 (CN) .......................... 201710196891.6

(51) Int. Cl.
*H03M 1/12* (2006.01)
*H03M 1/46* (2006.01)

(52) U.S. Cl.
CPC .......... *H03M 1/468* (2013.01); *H03M 1/1245* (2013.01)

(58) Field of Classification Search
CPC ...... H03M 1/168; H03M 1/44; H03M 1/0695; H03M 1/1215; H03M 1/1245; H03M 1/002; H03M 1/069
(Continued)

(56) References Cited

U.S. PATENT DOCUMENTS

| 6,963,300 | B1 | 11/2005 | Lee |
| 10,256,834 | B1 * | 4/2019 | Kinyua .................. H03M 1/145 |

(Continued)

FOREIGN PATENT DOCUMENTS

| CN | 101552609 A | 10/2009 |
| CN | 104038220 A | 9/2014 |

(Continued)

*Primary Examiner* — Linh V Nguyen

(57) ABSTRACT

The present disclosure provides a pipelined analog-to-digital converter having input signal pre-comparison and charge redistribution, including: one-stage or multi-stage of pipelined structure unit, a first flash analog-to-digital converter, and an adjusting output unit. Each stage of the pipelined structure unit is used to quantify the input signal. The first flash analog-to-digital converter quantizes a residual signal output by a final pipelined structure unit, and outputs a corresponding quantized value. The adjusting output unit combines each of the quantized values according to a connection order of the multi-stage pipelined structure unit and a flash analog-to-digital conversion unit to output a complete quantization result. By using the pre-comparison and charge redistribution technologies, the number of comparators of different stages of pipelined sub ADC is reduced and the low power consumption design is achieved, signal (Continued)

sample-and-hold and residual signal amplification establishing are simultaneously carried out, thus improving the conversion rate.

10 Claims, 3 Drawing Sheets

(58) Field of Classification Search
USPC .................. 341/118–121, 155, 161, 162
See application file for complete search history.

(56) References Cited

U.S. PATENT DOCUMENTS

| | | | | |
|---|---|---|---|---|
| 2012/0062400 | A1* | 3/2012 | Jeon | H03M 1/1038 341/118 |
| 2012/0086590 | A1* | 4/2012 | Satarzadeh | H03M 3/38 341/120 |
| 2012/0146820 | A1* | 6/2012 | Nam | H03M 1/069 341/110 |
| 2012/0146821 | A1* | 6/2012 | Nam | H03M 1/069 341/110 |
| 2013/0038478 | A1* | 2/2013 | Souchkov | H03M 1/1057 341/122 |
| 2013/0187805 | A1* | 7/2013 | Garrity | H03M 1/1215 341/155 |
| 2013/0321184 | A1* | 12/2013 | Lin | H03M 1/164 341/110 |
| 2014/0002291 | A1* | 1/2014 | Atriss | H03M 1/187 341/172 |
| 2015/0138007 | A1* | 5/2015 | Shiraishi | H03M 1/36 341/156 |
| 2016/0065231 | A1* | 3/2016 | Gonen | H03M 1/42 341/156 |

FOREIGN PATENT DOCUMENTS

| | | |
|---|---|---|
| CN | 104092462 A | 10/2014 |
| CN | 106921392 A | 7/2017 |

* cited by examiner

PIPELINED ANALOG-TO-DIGITAL CONVERTER HAVING INPUT SIGNAL PRE-COMPARISON AND CHARGE REDISTRIBUTION

CROSS REFERENCE TO RELATED APPLICATION

This is a Sect. 371 National Stage of PCT International Application No. PCT/CN2017/101184, filed on 11 Sep. 2017, which claims priority of a Chinese Patent Application No. 2017101968916 filed on 9 Mar. 2017, the contents of both applications hereby being incorporated by reference in their entireties for all purposes.

BACKGROUND

Field of Disclosure

The present disclosure relates to the field of integrated circuits, and in particular, to the technical field of high-precision ultra-high-speed low-power-consumption analog-to-digital converter design, and more particularly, to a pipelined analog-to-digital converter having input signal pre-comparison and charge redistribution.

Description of Related Arts

In signal processing systems such as communication systems and radar systems, an analog-to-digital converter has become an indispensable component. Commonly used analog-to-digital converters have medium-low-precision ultra-high-speed flash and Folding-Interpolating structures, and high-precision medium-low-speed Z-A and Successive Approximation Register (SAR) structures.

The above-mentioned analog-to-digital converter structure mainly focuses on medium-low-precision ultra-high-speed requirements and high-precision medium-low-speed requirements, and is difficult to be compatible with high-speed high-precision application environments. A pipelined analog-to-digital converter adopts a pipelined operation mode to quantize a single sample-and-hold result of an input signal step by step, and obtains a complete quantization result after a complete pipeline stage quantization, thereby improving the conversion speed of the pipelined analog-to-digital converter. The presence of an interstage residual amplifier reduces requirements to the comparator in the downstream pipeline and improves the conversion precision that the pipelined analog-to-digital converter can achieve, so that the pipelined analog-to-digital converter can not only achieve high-speed or ultra-high-speed converter speeds of hundred megahertz or even Gigahertz, but also achieve 16-bit conversion precision requirements.

A traditional pipelined analog-to-digital converter has the following three limitations: the coarse quantization precision of pipeline in each stage is limited by the gain bandwidth of the residual amplifier and the number of comparators in a sub analog-to-digital converter (Sub ADC), the high-precision conversion requirements can only be realized by increasing the number of pipeline stages. Input signal sampling and holding capacitors are time-division multiplexed into sub digital-to-analog converter (Sub DAC) capacitors in residual amplification circuits, that is, multiplying digital-to-analog converter (MDAC), resulting in that the sampling and holding process of various stages of analog-to-digital converters is mutually exclusive with the clock phase of residual signals in amplifying and setting process, that is, during the sampling and holding phase, the residual amplification circuit stops working, and during the residual amplifying phase, the sampling and holding network stops working, which seriously limits the conversion efficiency of the pipelined analog-to-digital converter.

The feedback factor of each stage of a negative feedback amplification circuit in the traditional pipelined analog-to-digital converter is limited by the coarse quantization precision of each stage of pipeline, which severely limits the design flexibility of the amplifier. At present, popular methods for improving pipeline conversion precision and speed mainly include successive approximation pipelined analog-to-digital converter structure and multi-channel time-interleaved analog-to-digital converter structure.

For successive approximation pipelined analog-to-digital converter structure, since it uses a successive approximation analog-to-digital converter as the Sub DAC of the pipelined analog-to-digital converter, its serial conversion process severely limits the increase of the conversion rate of the structure. Although the multi-channel time-interleaved analog-to-digital converter structure can increase the conversion rate very efficiently, its clock jitter and interchannel mismatch problem severely limit its application, and its power consumption increases as the number of channels increases, which is not conducive to low power consumption design.

SUMMARY OF THE PRESENT DISCLOSURE

The present disclosure provides a pipelined analog-to-digital converter having input signal pre-comparison and charge redistribution for solving the high power consumption problem of the traditional pipelined analog-to-digital converter.

The present disclosure provides a pipelined analog-to-digital converter having input signal pre-comparison and charge redistribution, including: one-stage or multi-stage of pipelined structure unit, a first flash analog-to-digital converter, and an adjusting output unit.

Each stage of the pipelined structure unit is used to quantify the input signal.

The first flash analog-to-digital converter is coupled with the pipelined structure unit, for quantizing a residual signal output by a final stage of the pipelined structure unit and outputting a corresponding quantized value.

The adjusting output unit is coupled with the pipelined structure unit, for combining each of the quantized values according to a connection order of the multi-stage pipelined structure unit and the flash analog-to-digital convertor to output a complete quantization result.

Each stage of the pipelined structure unit at least includes a corresponding sub analog-to-digital converter and a corresponding pre-comparison sub-unit, the sub analog-to-digital converter samples and holds an input signal, the pre-comparison sub-unit compares an input signal with a corresponding reference voltage, outputs a highest-bit quantized value of a current stage, and controls a switching state of a selection switch of a reference level in the sub analog-to-digital converter according to the highest-bit quantized value, the sub analog-to-digital converter coarsely quantizes a sampled input signal to output a corresponding quantized value according to the highest-bit quantized value and the switching state of the reference level.

In an embodiment of the present disclosure, the pre-comparison sub-unit includes a comparator, a pre-comparison switch, a reference voltage, and a reference level selector, a positive input end of the comparator is connected with the pre-comparison switch for receiving the input signal, a negative input end of the comparator is connected with the reference voltage, and an output end of the comparator is respectively connected with the reference level selector, the sub analog-to-digital converter, and latches under control of a clock signal $\phi_{sp}$, and outputs the highest-bit quantized value, and the reference level selector controls the switching state of the selection switch of the reference level in the sub analog-to-digital converter according to the highest-bit quantized value.

In an embodiment of the present disclosure, the sub analog-to-digital converter includes a plurality of one-bit quantization modules and coding modules, and output ends of the plurality of quantization modules are sequentially connected with input ends of the coding modules, a corresponding quantized value is output according to the highest-bit quantized value of the pre-comparison sub-unit.

In an embodiment of the present disclosure, each of the quantization modules includes a first sampling switch, a second flash analog-to-digital converter, a first reference level generator, a first reference level selection switch, and a second reference level selection switch, one end of the first sampling switch is connected for receiving the input signal, and the other end of the first sampling switch is connected with an input end of the second flash analog-to-digital converter, one ends of the first reference level selection switch and the second reference level selection switch are respectively connected with the other input end of the second flash analog-to-digital converter, and the other ends of the first reference level selection switch and the second reference level selection switch are respectively connected with an output end of the first reference level generator to output a corresponding reference level, and an output end of the second flash analog-to-digital converter outputs a corresponding quantized value under control of a clock signal Oc.

In an embodiment of the present disclosure, each stage of the pipelined structure unit further includes a sample-and-hold & digital-to-analog sub-unit, and a residual signal negative feedback amplification sub-unit, the sample-and-hold & digital-to-analog sub-unit samples and holds the input signal, and outputs a matched level value according to a quantized value of a current stage of the sub analog-to-digital converter, the residual signal negative feedback amplification sub-unit redistributes charges corresponding to the level value and outputs a residual signal.

In an embodiment of the present disclosure, the sample-and-hold & digital-to-analog sub-unit includes a second sampling switch, a second sampling capacitance, a second lower board sampling switch, and a second reference level generator, one end of the second sampling switch is connected for receiving the input signal, the other end of the second sampling switch is connected with the second sampling capacitance, an output end of the second reference level generator is connected between a lower board of the second sampling capacitance and the second sampling switch, the second reference level generator generates a reference voltage according to a current quantized value of the sub analog-to-digital converter under control of a clock signal $\phi_{qs}$, and an upper board of the second sampling capacitance is connected with a grounded second lower board sampling switch.

In an embodiment of the present disclosure, the residual signal negative feedback amplification sub-unit includes a residual amplifier input signal switch, a residual signal amplification switch, a first reset switch, a second reset switch, a residual amplifier input signal holding capacitance, a negative feedback capacitance and a residual amplifier, one end of a residual signal generating switch is connected with an output end of the sample-and-hold & digital-to-analog sub-unit, and the other end is respectively connected with one ends of a negative input end of the residual amplifier, the first reset switch, the residual signal amplification switch, and the residual amplifier input signal holding capacitance, the other ends of the residual amplifier input signal holding capacitance and the first reset switch are grounded; a positive input end of the residual amplifier is grounded, an output end of the residual amplifier outputs a residual signal, the output end of the residual amplifier is fed back to the other end of the residual signal amplification switch through a negative feedback capacitance, one end of the second reset switch is connected for receiving an output residual signal, and the other end of the second reset switch is grounded.

In an embodiment of the present disclosure, sample-and-hold processes of the sub analog-to-digital converter and the sample-and-hold & digital-to-analog sub-unit in each stage of the pipelined structure unit are synchronized with a residual signal amplification process of a residual signal negative feedback amplification sub-unit and operate independently.

In an embodiment of the present disclosure, a relationship between the second sampling capacitance $C_s$, the residual amplifier input signal holding capacitance $C_c$ and the negative feedback capacitance $C_f$ in each stage of the pipelined structure unit is: $C_f=(C_s \cdot C_c)/(A_{closeloop} \cdot (C_s+C_c))$, wherein $A_{closeloop}$ indicates a closed-loop amplification factor of the residual amplification circuit, a feedback factor of a residual signal negative feedback amplification circuit is $(C_f (C_s+C_c))/(C_s C_c)$, and sizes of the second sampling capacitance $C_s$ and the residual amplifier input signal holding capacitance $C_c$ are selected to control a magnitude of a negative feedback factor.

In an embodiment of the present disclosure, the sub analog-to-digital converter is scaled with a sampling network in the sample-and-hold & digital-to-analog sub-unit, and the sampling network has a same time constant.

In an embodiment of the present disclosure, the number of bits of quantization precision of the first flash analog-to-digital converter is the same as the number of bits of quantization precision of each stage of the pipeline structure unit.

As described above, the pipelined analog-to-digital converter having input signal pre-comparison and charge redistribution of the present disclosure has the following beneficial effects:

Firstly, the highest-bit coarse quantization process of each pipeline of the pipelined analog-to-digital converter is combined with the sample-and-hold process, and the quantization precision is increased by 1 bit in the case where the number of comparators in the sub analog-to-digital converter is the same, thereby reducing the number of stages of the pipelined analog-to-digital converter and reducing overall power consumption with the same conversion precision.

Secondly, the appropriate reference level is established according to the coarse quantization result of each stage of the pipelined analog-to-digital converter, and the residual amplifier input signal is maintained on the residual amplifier input signal holding capacitor $C_c$ by the capacitance redistribution principle. After the residual amplifier input signal is established, the second sampling capacitor $C_s$ and the residual amplifier input signal holding capacitor $C_c$ are disconnected. At this time, the second sampling capacitor $C_s$ and the residual amplifier input signal holding capacitor $C_c$ are separated, so that the sample-and-hold circuit is independent of the residual amplification circuit, and the sample-and-hold process is synchronized with the residual amplification process to improve the conversion rate of the analog-to-digital converter.

Thirdly, the lower board of the residual amplifier input signal holding capacitor $C_c$ is connected to the reference ground all the time, and has the same effect as a ground parasitic capacitance on the input node of the residual amplifier. Therefore, the charge redistribution technique used in the present disclosure can use the parasitic capacitance of the input node of the residual amplifier as the effective capacitance of the system signal processing to eliminate the influence of this part of the parasitic capacitance.

Fourthly, a relationship between the second sampling capacitor $C_s$, the residual amplifier input signal holding capacitor $C_c$ and the negative feedback capacitor $C_f$ of the residual amplification circuit in each stage of the pipeline is: $C_f = (C_s \cdot C_c)/(A_{closeloop} \cdot (C_s + C_c))$, $A_{closeloop}$ indicates a closed-loop amplification factor of the residual amplification circuit, a feedback factor of a residual signal negative feedback amplification circuit is: $(C_f \cdot (C_s + C_c))/(C_s \cdot C_c)$, and proper capacitive sizes of the sampling capacitor $C_s$ and the residual amplifier input signal holding capacitor $C_c$ in each stage of the pipeline are selected to change the negative feedback factor, which is convenient for flexible design of residual amplifier.

DESCRIPTION OF COMPONENT MARK NUMBERS

Figure 1:
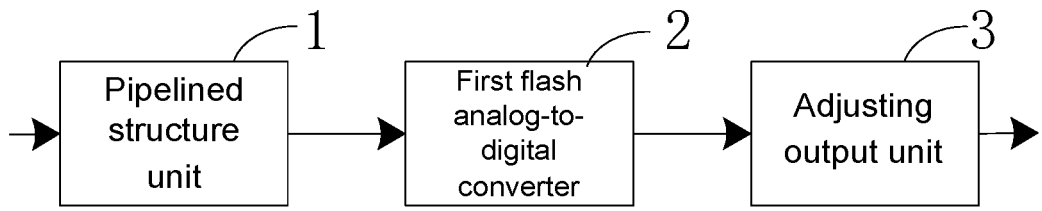
FIG. 1 shows a block diagram of a pipelined analog-to-digital converter having input signal pre-comparison and charge redistribution according to an embodiment of the present disclosure.
Figure 2:
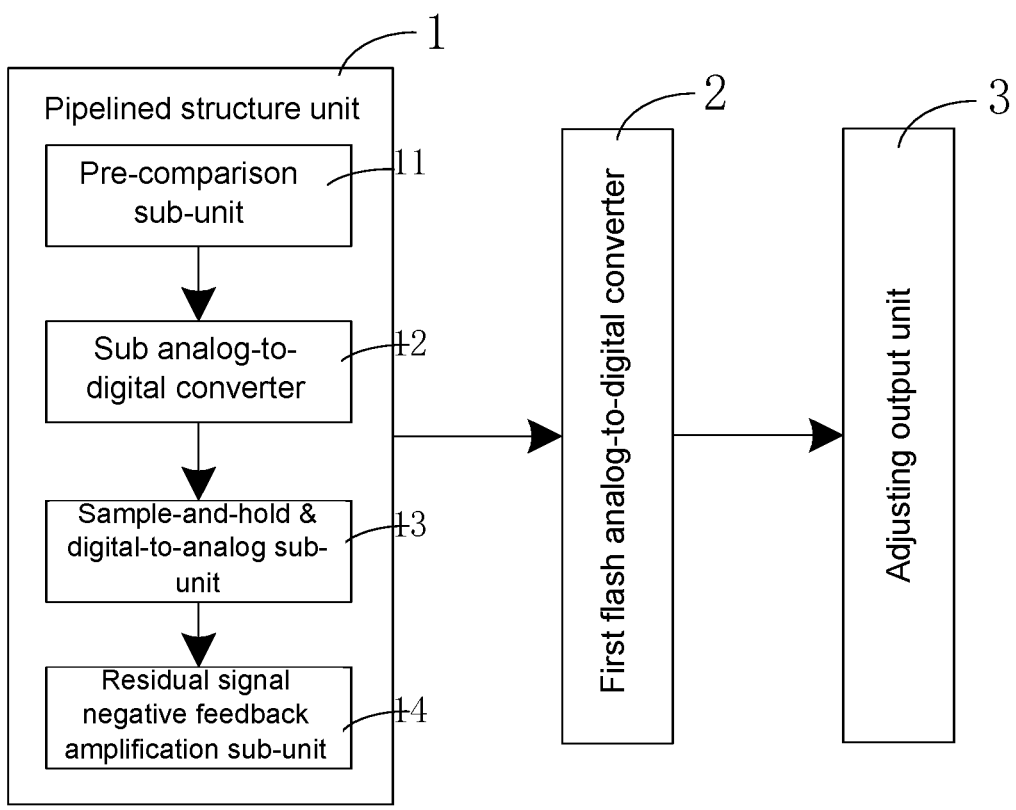
FIG. 2 shows a block diagram of each stage of the pipelined structure unit in the pipelined analog-to-digital converter in FIG. 1 according to an embodiment of the present disclosure.

1 Pipelined structure unit
2 First flash analog-to-digital converter
3 Adjusting output unit
11 Pre-comparison sub-unit
12 Sub analog-to-digital converter
13 Sample-and-hold & digital-to-analog sub-unit
14 Residual signal negative feedback amplification sub-unit

DETAILED DESCRIPTION OF THE PREFERRED EMBODIMENTS

The implementation mode of the present disclosure will be described below through specific embodiments. Those skilled in the art can easily understand other advantages and effects of the present disclosure according to contents disclosed by the specification.

The present disclosure can also be implemented or applied through other different specific implementation modes. Various modifications or changes can also be made to all details in the specification based on different points of view and applications without departing from the spirit of the present disclosure. It needs to be stated that the following embodiments and the features in the embodiments can be combined with one another under the situation of no conflict.

It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complex.

Referring to FIG. 1, the present disclosure provides a pipelined analog-to-digital converter having input signal pre-comparison and charge redistribution, including: one-stage or multi-stage of pipelined structure unit 1, a first flash analog-to-digital converter 2, and an adjusting output unit 3.

Each stage of the pipelined structure unit 1 is used to quantify the input signal.

The first flash analog-to-digital converter 2 is coupled with the pipelined structure unit 1, for quantizing a residual signal output by a final stage of the pipelined structure unit and outputting a corresponding quantized value.

The adjusting output unit 3 is coupled with the first flash analog-to-digital converter, for combining the quantized values according to a connection order of the multi-stage pipelined structure unit and the flash analog-to-digital converter to output a complete quantization result.

The present application includes multi-stage pipelined structure unit 1, the pipelined structure unit 1 in FIG. 1 is only one representative, and each stage of the pipelined structure unit 1 at least includes a corresponding Sub DAC 12 and a corresponding pre-comparison sub-unit 11. The Sub DAC 12 samples and holds an input signal. The pre-comparison sub-unit 11 compares an input signal with a corresponding reference voltage, outputs a highest-bit quantized value of a current stage, and controls a switching state of a reference level selection switch in the Sub DAC according to the highest-bit quantized value. The Sub DAC 12 further coarsely quantizes a sampled input signal to output a corresponding quantized value according to the highest-bit quantized value and the switching state of the reference level.

In an embodiment of the present disclosure, the reference voltage connected with the pre-comparison sub-unit 11 is determined according to the number of bits of conversion precision of each stage of the pipelined structure unit (i.e., the Sub DAC 12), where the reference voltage is preferably an intermediate value of multiple reference voltages, such as: $V_{ref0}, V_{ref1} \ldots V_{refn-1}$, when the precision of the Sub DAC 12 is N bits, it corresponds to $2^N$ reference voltages, that is, the intermediate value is a reference voltage corresponding to $2^{N-1}$. The present disclosure is applied to the field of integrated circuits, in particular to the field of high-precision high-speed low-power analog-to-digital converter design. The present disclosure adopts a pipelined structure, adopts a pre-comparison technique for input signals, obtains the highest-bit coarse quantization of each stage of the pipelined structure unit by using a pre-comparison unit, and reduces the number of comparators of the Sub DAC in each stage of pipelined structure unit, so that the number thereof is reduced by half, which greatly saves power consumption and reduces cost.

In the above embodiment, the number of bits of the quantization precision of the first flash analog-to-digital converter 2 may be different from the number of bits of the quantization precision of each stage of the pipelined structure unit 1, and the first flash analog-to-digital converter 2 does not output a corresponding residual signal when the analog-to-digital conversion is performed, and it only needs to coarsely quantize the signal connected to its input end.

Specifically, the pre-comparison sub-unit 11 (pre-comparison circuit) includes a comparator, a pre-comparison switch, a reference voltage, and a reference level selector, a positive input end of the comparator is connected with the pre-comparison switch for receiving the input signal, a negative input end of the comparator is connected with the reference voltage, and output ends of the comparator are respectively connected with the reference level selector, the Sub DAC. The output ends of the comparator latch and output the highest-bit quantized value under control of a clock signal $\phi_{sp}$. The reference level selector controls the state of the reference level selection switch in the Sub DAC according to the highest-bit quantized value.

In this embodiment, the reference level selector outputs a level switch control signal to control the state thereof according to a specific value of the highest-bit quantized value. A plurality of first reference level selection switches and second reference level selection switches are disposed in the Sub DAC. When the highest-bit quantized value is at high level, the first level switch is in a closed state, the second level switch is in an off state. When the highest-bit quantized value is at low level, the first level switch is in an off state, and the second level switch is in a closed state. That is, a switching state of an internal reference level selection switch in the Sub DAC is controlled. In addition, the reference voltage in the pre-comparison sub-unit 11 is generally an intermediate value output by the reference level generator.

Specifically, the Sub DAC 12 includes a plurality of one-bit quantization modules and coding modules. Output ends of the plurality of quantization modules are sequentially connected with input ends of the coding modules, the output end of the coding module is connected with the input end of the adjusting output unit to output the multi-bit coarse quantized value of each stage of the pipelined structure unit under the input of the highest-bit quantized value of the pre-comparison sub-unit.

In this embodiment, the conversion precision of the Sub DAC 12 is n bits, which corresponds to $2^{n-1}-1$ quantization modules, n is a natural number greater than or equal to 1, and each quantization module is connected to the input end of the coding module from high to low or from low to high, the coarse bit quantization is performed according to the connection order. In addition, the sample-and-hold circuit is integrated in each quantization module, which will not be repeated herein.

Specifically, each of the quantization modules includes a first sampling network, a second flash analog-to-digital converter, a first reference level generator, a first reference level selection switch and a second reference level selection switch. One end of the first sampling network is connected for receiving the input signal, and the other end of the first sampling network is connected with an input end of the second flash analog-to-digital converter. One end of the first reference level selection switch and the second reference level selection switch are respectively connected between the second flash analog-to-digital converter and the first sampling network, the other end of the first reference level selection switch and the second reference level selection switch are respectively connected with an output end of the first reference level generator to output a corresponding reference level. Another input end of the second flash analog-to-digital converter is grounded, and an output end of the second flash analog-to-digital converter outputs a corresponding quantized value under control of a clock signal $\phi_c$.

In this embodiment, the first sampling switch, the first sampling capacitance, and the first lower board sampling switch constitute a first sampling network. The combination of the first sampling network and the comparator is equivalent to the second flash analog-to-digital converter. One end of the first sampling switch is connected for receiving the input signal, and the other end of the first sampling switch is connected with an upper board of the first sampling capacitance, a lower board of the first sampling capacitance is respectively connected with a positive input end of the comparator and one end of the first lower board sampling switch, and the other end of the first lower board sampling switch is grounded, a negative input end of the comparator is grounded. One end of the first reference level selection switch and the second reference level selection switch are respectively connected between a first sampling switch and a first sampling capacitance, the other ends thereof are respectively connected with an output end of the reference level generator to output a corresponding reference level. The difference between the sampled value of the first sampling network and the reference level output by the first reference level generator is compared with the negative input end of the comparator, and the output end of the comparator outputs the corresponding quantized value under control of the clock signal $\phi_c$.

In this embodiment, the first sampling switch, the first sampling capacitor and the first lower board sampling switch constitute a sample-and-hold circuit, that is, a first sampling network. The first sampling network is scaled with a sampling network in the sample-and-hold & digital-to-analog sub-unit. The sampling networks both have a same time constant, which prevents distortion of the sampling network due to mismatch of the time constant.

Each bit quantization module corresponds to a connected reference level generator according to its arrangement positional relationship in the Sub DAC, and the output end of the first reference level generator outputs an appropriate reference level $V_{ref0}, V_{ref1} \ldots V_{refn-1}$, wherein $n=2^N$, according to the arrangement relationship of each quantization module, one ends of the first reference level selection switch and the second reference level selection switch in each quantization module are respectively connected with two reference voltages with a number difference of $2^{N-1}$, where N is the number of conversion precision bits of the Sub DAC, and N is at least one bit, that is, the arrangement is performed one by one according to the initial order of the reference level $V_{ref1}, V_{ref(1+2N-1)}$, the arrangement is performed successively from high to low or from low to high.

The first reference level selection switch and the second reference level selection switch are respectively connected with two reference voltages with a number difference of $2^{N-1}$, and one of the first reference level selection switch and the second reference level selection switch is controlled to be in the off state and the other is in the closed state according to whether the highest-bit quantized value output by the pre-comparison sub-unit is at high level or low level (details will not be described herein). The closed reference level is connected with an input end of the second flash analog-to-digital converter, the clock signal $\phi_c$ is connected with a control input end of the second flash analog-to-digital converter (Flash ADC). One end of the first sampling switch $S_{sc}$ is connected for receiving the input signal, the other end thereof is connected with the input end of the second Flash ADC. The quantized value output by the Flash ADC is connected with the input end of the coding module, the input end of the coding module is also connected with an output end of the comparator in the pre-comparison sub-unit, and the output end of the coding module is connected with an input end of an output aligning unit.

Specifically, each stage of the pipelined structure unit further includes a sample-and-hold & digital-to-analog sub-unit 13 (sample-and-hold & digital-to-analog converter), and a residual signal negative feedback amplification sub-unit 14. The sample-and-hold & digital-to-analog sub-unit 13 samples and holds the input signal, and outputs a matched level value according to a quantized value of a current stage of the Sub DAC. The residual signal negative feedback amplification sub-unit 14 redistributes charges corresponding to the level value and outputs a residual signal.

In this embodiment, the sample-and-hold & digital-to-analog sub-unit 13 and the residual signal negative feedback amplification sub-unit 14 utilize the charge redistribution technique to simultaneously perform input signal sampling and residual signal generation and amplification processes using two sets of sampling capacitors, such that the capacitors in the signal sampling and the residual signal amplification establishing processes are independent of each other at the same time, thus realizing the purpose that the signal sample-and-hold and the residual signal amplification establishing are performed simultaneously, thereby greatly improving the conversion rate of the pipelined analog-to-digital converter.

Specifically, the sample-and-hold & digital-to-analog sub-unit 13 includes a second sampling switch, a second sampling capacitor, a second lower board sampling switch, and a second reference level generator. One end of the second sampling switch is connected for receiving the input signal, the other end of the second sampling switch is connected with the second sampling capacitor. An output end of the second reference level generator is connected between a lower board of the second sampling capacitor and the second sampling switch. The second reference level generator generates a reference voltage according to a current quantized value of the Sub DAC under control of a clock signal $\phi_{qs}$, and an upper board of the second sampling capacitor is connected with a grounded second lower board sampling switch.

Specifically, the residual signal negative feedback amplification sub-unit 14 includes a residual amplifier input signal switch, a residual signal amplification switch, a first reset switch, a residual amplifier input signal holding capacitance, a negative feedback capacitor, a second reset switch and a residual amplifier. One end of a residual signal generating switch is connected with an output end of the sample-and-hold & digital-to-analog sub-unit, and the other end thereof is respectively connected with a negative input end of the residual amplifier, one end of the first reset switch, one end of the residual signal amplification switch, and one end of the residual amplifier input signal holding capacitance, the other ends of the residual amplifier input signal holding capacitance and the first reset switch are grounded. A positive input end of the residual amplifier is grounded, an output end of the residual amplifier outputs a residual signal, the output end of the residual amplifier is fed back to the other end of the residual signal amplification switch through a negative feedback capacitance. One end of the second reset switch is connected for receiving an output residual signal, and the other end of the second reset switch is grounded.

In this embodiment, the residual amplifier input signal is grounded through the lower board of the residual amplifier input signal holding capacitor $C_c$, and has the same effect as the ground parasitic capacitance on the input node of the residual amplifier. In addition, the charge redistribution technique can use the parasitic capacitance of the input node of the residual amplifier as the effective capacitance of the system signal processing to eliminate the influence of this part of the parasitic capacitance.

In addition, when the sub analog-to-digital converter in each stage of the pipelined structure unit outputs the coarse quantized result, the sample-and-hold & digital-to-analog sub-unit outputs an appropriate reference level according to the coarse quantized result, and its corresponding charge is distributed to the residual amplifier input signal holding capacitor $C_c$ by using the capacitance redistribution principle, and after the residual amplifier input signal is established, the connection relationship between the second sampling capacitor $C_s$ and the residual amplifier input signal holding capacitor $C_c$ is disconnected. At this time, the second sampling capacitor $C_s$ and the residual amplifier input signal holding capacitor $C_c$ are separated, that is, the sample-and-hold & digital-to-analog sub-unit is independent of the residual amplification circuit, thus realizing that the sample-and-hold process is synchronized with the residual amplification process, thereby improving the conversion rate of the analog-to-digital converter.

In an embodiment of the present disclosure, a relationship between the second sampling capacitor $C_s$, the residual amplifier input signal holding capacitor $C_c$ and the negative feedback capacitor $C_f$ in each stage of the pipelined structure unit is: $C_f = (C_s \cdot C_c)/(A_{closeloop} \cdot (C_s + C_c))$, $A_{closeloop}$ indicates a closed-loop amplification factor of the residual amplification circuit, a feedback factor of a residual signal negative feedback amplification circuit is $(C_f \cdot (C_s + C_c))/(C_s \cdot C_c)$, and sizes of the second sampling capacitor $C_s$ and the residual amplifier input signal holding capacitor $C_c$ are selected to control a magnitude of a negative feedback factor.

In this embodiment, proper capacitive sizes of the second sampling capacitor $C_s$ and the residual amplifier input signal holding capacitor $C_c$ in each stage of the pipeline are selected to adjust the negative feedback factor, which is convenient for flexible design of residual amplifier.

Figure 3:
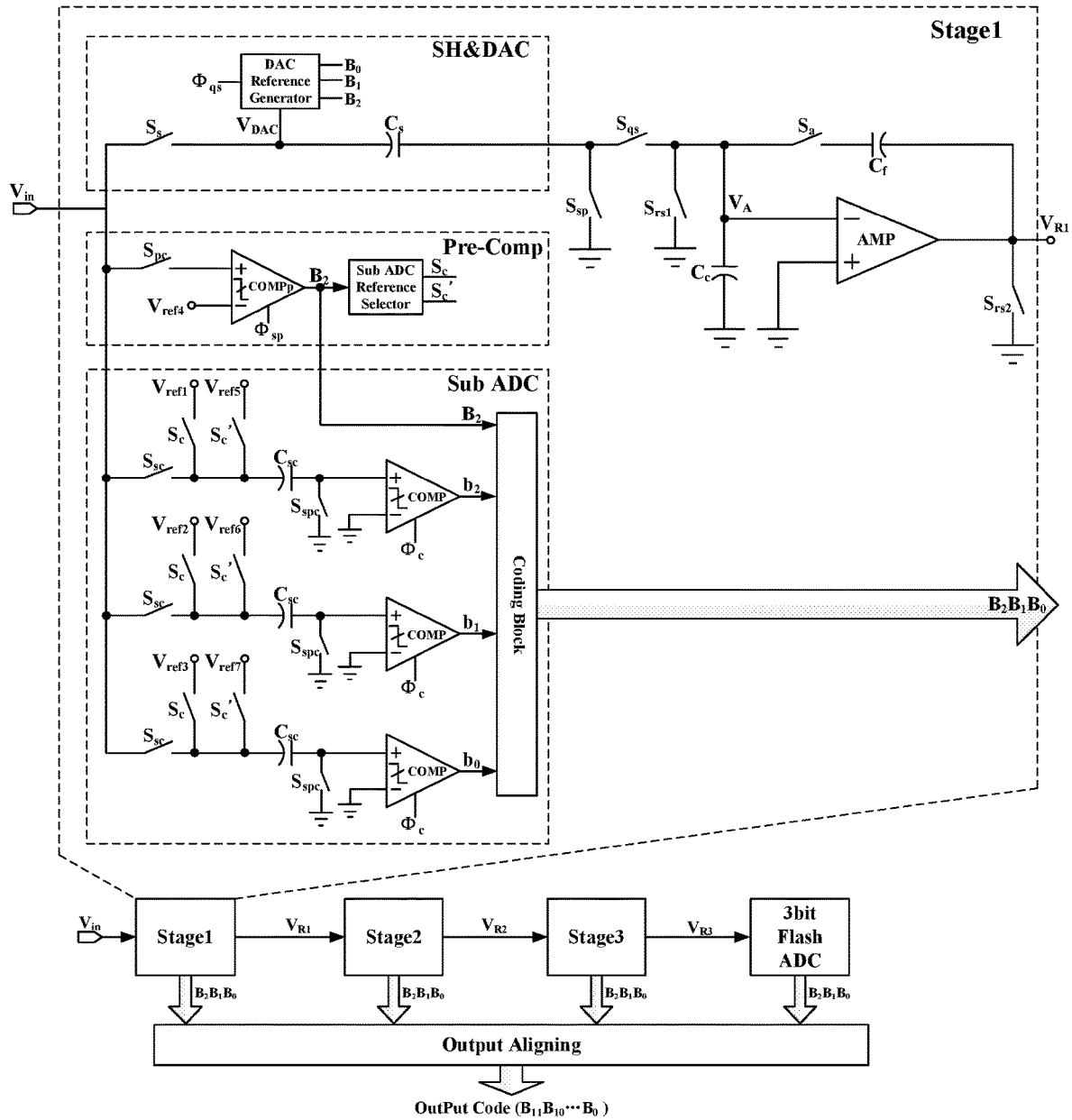
FIG. 3 shows a circuit diagram of a pipelined analog-to-digital converter having 12-bit conversion precision of input signal pre-comparison and charge redistribution according to an embodiment of the present disclosure.

FIG. 3 shows a circuit diagram of a pipelined analog-to-digital converter having 12-bit conversion precision of input signal pre-comparison and charge redistribution according to an embodiment of the present disclosure, details will be described as follows.

The analog-to-digital converter includes 3-stage 3-bit pipelined structure units (Stage1, Stage2, and Stage3) of coarse quantization precision, a 1-stage 3-bit flash analog-to-digital converter (3-bit Flash ADC) of coarse quantization precision, and an output aligning unit.

Each stage of the pipelined structure includes a sample-and-hold & digital-to-analog converter (SH&DAC), a pre-comparison circuit (Pre-Comp), a Sub ADC, a second lower board sampling switch $S_{sp}$, a residual amplifier input signal switch $S_{qs}$, a residual amplifier input signal holding capacitor $C_c$, a residual amplifier reset switch $S_{rs1}$, a residual amplifier reset switch $S_{rs2}$, a residual signal amplification switch $S_a$, a negative feedback capacitor $C_f$, and a residual amplifier (AMP), etc.

The SH&DAC includes a second sampling switch $S_s$, a second sampling capacitor $C_s$, and a second reference level generator (DAC Reference Generator). The input signal pre-comparison circuit (Pre-Comp) includes a pre-comparison switch $S_{pc}$, a comparator COMPp, a reference voltage $V_{ref4}$, and a Sub ADC Reference Selector that connect the input signal.

The Sub ADC includes a first sampling switch $S_{sc}$, a first sampling capacitor $C_{sc}$, a first lower polar plate sampling switch $S_{spc}$, Sub ADC reference levels $V_{ref1}$, $V_{ref2}$, $V_{ref3}$, $V_{ref4}$, $V_{ref5}$, $V_{ref6}$, and $V_{ref7}$ provided by a reference level generator, Sub ADC reference level selection switches $S_c$ and $S_c'$, three comparators COMP, and a Coding Block. The corresponding sampling network in each comparator and Sub ADC is equivalent to the second flash analog-to-digital converter. The sampling network composed of the second sampling switch $S_s$, the second sampling capacitor $C_s$, and the second lower board sampling switch $S_{sp}$ in the SH&DAC must be scaled with the sampling network composed of the first sampling switch $S_{sc}$, the first sampling capacitor $C_{sc}$ and the first lower board sampling switch $S_{spc}$ in the Sub ADC, to ensure that the two sampling networks have the same time constant.

Figure 4:
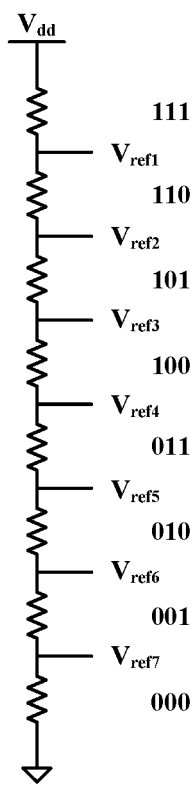
FIG. 4 shows a schematic diagram of a coarse quantization reference voltage of each stage of the pipeline of the pipelined analog-to-digital converter which implements 12-bit conversion precision in FIG. 3.

FIG. 4 shows a schematic diagram of a coarse quantized reference voltage of each stage of the pipeline of the pipelined analog-to-digital converter which implements 12-bit conversion precision using a pipelined analog-to-digital converter technique based on input signal pre-comparison and charge redistribution. It is used to describe the reference voltage amplitude relationship in the input signal comparison circuit (Pre-Comp) and the Sub ADC, in which $V_{dd}$ represents the power supply and the inverted triangle symbol represents the reference ground.

Figure 5:
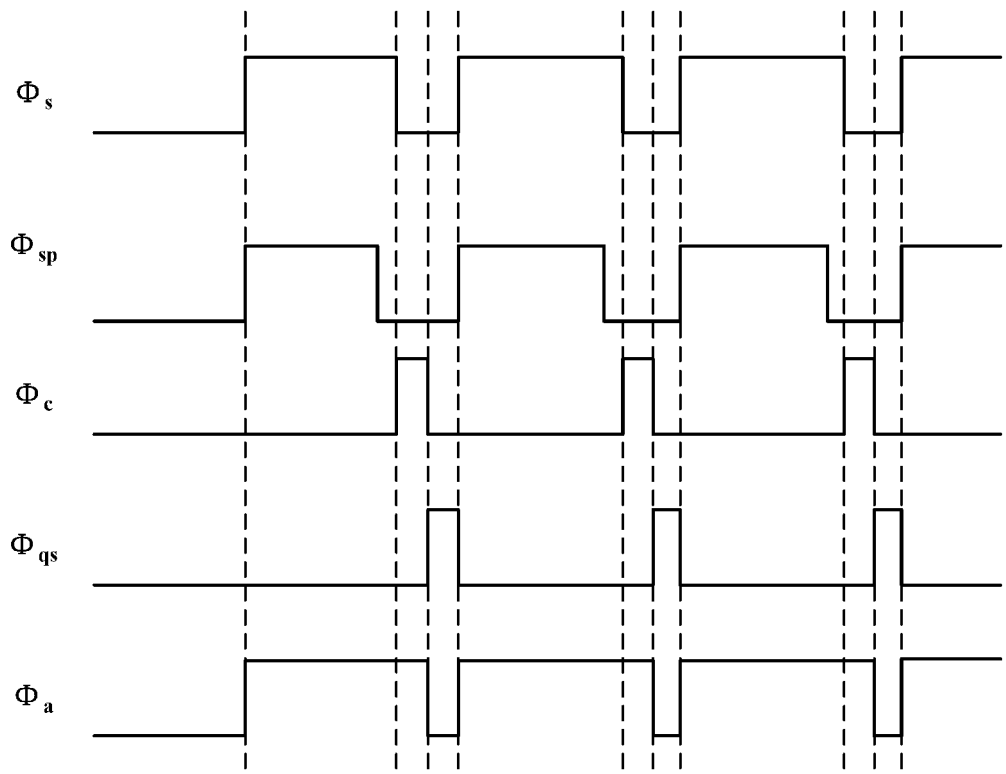
FIG. 5 shows a timing diagram of a pipelined analog-to-digital converter that implements 12-bit conversion precision using a pipelined analog-to-digital converter having input signal pre-comparison and charge redistribution according to an embodiment of the present disclosure.

FIG. 5 shows a timing diagram of a pipelined analog-to-digital converter that implements 12-bit conversion precision using a pipelined analog-to-digital converter based on input signal pre-comparison and charge redistribution according to an embodiment of the present disclosure, to describe the timing relationship of each module unit of the analog-to-digital converter according to an embodiment of the present disclosure.

As shown in FIG. 3, FIG. 4 and FIG. 5, the working principle of the pipelined analog-to-digital converter that implements 12-bit conversion precision using a pipelined analog-to-digital converter based on input signal pre-comparison and charge redistribution according to an embodiment of the present disclosure is described as follows.

Firstly, the working process of the first-stage pipeline (Stage 1) is described as follows.

The first stage: as shown in FIG. 5, when the clock signal $\phi_s$ and $\phi_{sp}$ are at high level, the first stage pipeline (stage 1) of the analog-to-digital converter is shown in FIG. 3, the first sampling switch $S_{sc}$, the second sampling switch $S_s$, the first lower board sampling switch $S_{spc}$, the second lower board sampling switch $S_{sp}$, and the pre-comparison switch $S_{pc}$ of the input signal are all in an on state, the SH&DAC and the Sub ADC enter a sampling phase, and the pre-comparison circuit (Pre-Comp) enters a pre-comparison phase.

The second stage: as shown in FIG. 5, when the falling edge of the clock signal $\phi_{sp}$ comes, the first sampling switch $S_{sc}$ and the second sampling switch $S_s$ continue to be on, the first lower board sampling switch $S_{spc}$ and the second lower board sampling switch $S_{sp}$ are both in an off state, the second sampling capacitor $C_s$ of the SH&DAC and the first sampling capacitor $C_{sc}$ of the Sub ADC maintain the input signal amplitude at the moment, the amount of the charges of the second sampling capacitor $C_s$ and the upper board of the first sampling capacitor $C_{sc}$ is respectively: $Q_s = (-V_{in(0)}) \cdot C_s$ and $Q_{sc} = -V_{in(0)} \cdot C_{sc}$, the pre-comparison switch $S_{pc}$ in the pre-comparison circuit (Pre-Comp) is turned off, and its corresponding comparator COPMp latches and outputs a comparison result of the input signal $V_{in(0)}$ with the reference level $V_{ref4}$.

The Sub ADC Reference Selector in the pre-comparison circuit (Pre-Comp) control the reference level selection switches $S_c$ and $S_c'$ according to the latch result of the comparator COMPp. If the input signal $V_{in(0)}$ is higher than the reference level $V_{ref4}$, the comparator COMPp outputs a high level, the reference level selection switch $S_c$ of the Sub ADC is on, and the reference level selection switch $S_c'$ of the Sub ADC is off, the Sub ADC choose the reference levels $V_{ref1}$, $V_{ref2}$, and $V_{ref3}$ shown in FIG. 4 to perform coarse quantization to the last two bits of the current pipeline. If the input signal $V_{in(0)}$ is lower than the reference level $V_{ref4}$, then the comparator COMPp outputs a low level, the Sub ADC reference level selection switch $S_c$ is off, the Sub ADC reference level selection switch $S_c'$ is on. The Sub ADC choose the reference levels $V_{ref5}$, $V_{ref6}$, and $V_{ref}$ shown in FIG. 4 to perform coarse quantization to the last two bits of the current pipeline.

The third stage: as shown in FIG. 5, when the clock signals $\phi_c$ and $\phi_a$ are at high level, the residual amplifier reset switch $S_{rs1}$, the residual amplifier reset switch $S_{rs2}$, and the residual signal amplification switch $S_a$ are on, the residual amplifier AMP enters the reset phase.

The comparator COMP of the Sub ADC latches and outputs a coarse quantized result of the input signal $V_{in(0)}$ in the last two bits of the current pipeline, if the input signal $V_{in(0)}$ is less than or equal to $V_{ref3}$ or $V_{ref7}$ (i.e., the difference between them is compared with the other input end of the comparator), then the three comparators COMP of the Sub ADC outputs that $b_2b_1b_0=000$. If the input signal $V_{in(0)}$ is greater than $V_{ref3}$ or $V_{ref7}$, and less than or equal to $V_{ref2}$ or $V_{ref6}$ (i.e., the difference between them is compared with the other input end of the comparator), then the three comparators COMP of the Sub ADC outputs that $b_2b_1b_0=001$. If the input signal $V_{in(0)}$ is greater than $V_{ref2}$ or $V_{ref6}$, and less than or equal to $V_{ref1}$ or $V_{ref5}$ (i.e., the difference between them is compared with the other input end of the comparator), then the three comparators COMP of the Sub ADC outputs that $b_2b_1b_0=011$. If the input signal $V_{in(0)}$ is greater than $V_{ref1}$ or $V_{ref5}$ (i.e. the difference between them is compared with the other input end of the comparator), then the three comparators COMP of the Sub ADC outputs that $b_2b_1b_0=111$.

The coding block of the Sub ADC encodes and outputs a three-bit coarse quantized result $B_2B_1B$ according to a comparison result $B_2$ of the pre-comparison circuit (Pre-Comp) and a coarse quantized result $b_2b_1b$ of the Sub-ADC. When $B_2=0$ and $b_2b_1b_0=000$, $B_2B_1B_0=000$. When $B_2=0$ and $b_2b_1b_0=001$, $B_2B_1B_0=001$. When $B_2=0$ and $b_2b_1b_0=011$, $B_2B_1B_0=010$. When $B_2=0$ and $b_2b_1b_0=111$, $B_2B_1B_0=011$. When $B_2=1$ and $b_2b_1b_0=000$, $B_2B_1B_0=100$. When $B_2=1$ and $b_2b_1b_0=001$, $B_2B_1B_0=101$. When $B_2=1$ and $b_2b_1b_0=011$, $B_2B_1B_0=110$. When $B_2=1$ and $b_2b_1b_0=111$, $B_2B_1B_0=111$.

The fourth stage: as shown in FIG. 5, when the clock signal $\phi_{qs}$ is at high level, the residual amplifier input signal switch $S_{qs}$ is on, and the second reference level generator (DAC Reference Generator) in the SH&DAC generates an appropriate DAC reference level $V_{DAC}$ according to the 3-bit complete coarse quantized result $B_2B_1B_0$ of the current stage of pipeline, thus generating a residual amplifier input signal $V_A$ on the upper board of the second sampling capacitor $C_s$ of the SH&DAC connected with the residual amplifier input signal holding capacitor $C_c$. According to the charge conservation principle, the total amount of charges on the upper board of the second sampling capacitor $C_s$ of the SH&DAC connected with the residual amplifier input signal holding capacitor $C_c$ is the same before and after the residual amplifier input signal switch $S_{qs}$ is on, that is, $Q_s = (-V_{in(0)}) \cdot C_s = (V_A - V_{DAC}) \cdot C_s + V_A \cdot C_c$, so that the input signal level of the residual amplifier is $V_A = (C_s/(C_s + C_c)) \cdot (-V_{in(0)} + V_{DAC})$.

In the fifth stage, as shown in FIG. 5, when the clock signals $\phi_a$, $\phi_s$, and $\phi_{sp}$ are at high level and the rest clock signals are at low level, the residual amplifier input signal switch $S_{qs}$ is off, the residual signal amplification switch $S_a$ is on, the residual signal amplification circuit of the first stage of pipeline (Stage 1) enters a residual signal amplifying phase. According to the charge conservation principle of the upper board the residual amplifier input signal holding capacitor $C_c$ and negative feedback operational amplifier principle, output signal $V_{R1} = (-C_c C_s)/(C_f (C_c + C_s)) \cdot (-V_{in(0)} + V_{DAC})$.

The desired input signal amplification factor and residual signal output amplitude range can be obtained by designing an appropriate capacitor value of the negative feedback capacitor $C_f$ and the DAC reference level $V_{DAC}$. For example, to satisfy the 3-bit coarse quantization precision requirement of the present preferred embodiment, it is designed that capacitance value of the negative feedback capacitor $C_f = (C_c C_s)/(8 \cdot (C_c + C_s))$, the DAC reference level $V_{DAC} = (i \cdot V_{ref})/16$, in the present application, · represents a multiplication sign, $V_{ref}$ represents an analog-to-digital converter output amplitude, and the variable i is selected from (±1, ±3, ±5, ±7) according to the coarse quantization precision output result $B_2 B_1 B_0$ of the current stage of pipeline.

When the coarse quantization precision output result of the current stage of pipeline $B_2 B_1 B_0 = 000$, i=7. When $B_2 B_1 B_0 = 001$, i=5. When $B_2 B_1 B_0 = 010$, i=3. When $B_2 B_1 B_0 = 011$, i=1. When $B_2 B_1 B_0 = 100$, i=(−1). When $B_2 B_1 B_0 = 101$, i=(−3). When $B_2 B_1 B_0 = 110$, i=(−5). When $B_2 B_1 B_0 = 111$, i=(−7). At this time, the SH&DAC and the Sub ADC in the first stage of pipeline enter the sampling process of the first stage again, track and sample the input signal $V_{in(1)}$. The pre-comparison circuit (Pre-Comp) again enters the input signal pre-comparison process of the first stage described above. The SH&DAC and the Sub ADC in the second stage of pipeline (Stage 2) enter the sampling process of the first stage, and tracks the residual amplification output signal $V_{R1}$ of the first stage of pipeline (Stage 1). The pre-comparison circuit (Pre-Comp) enters the input signal pre-comparison process of the first stage described above.

In the sixth stage, as shown in FIG. 5, when the falling edge of the clock signal $\phi_{sp}$ comes, the first stage of pipeline (Stage 1) enters the second stage described above, and the coarse quantization process of the output signal $V_{in(1)}$ is performed. After the sampling and pre-comparison processes of the second stage of pipeline (Stage 2) end, entering the second stage described above, and further quantizing the residual signal $V_{R1}$ of the input signal $V_{in(0)}$ due to coarse quantization in the first stage (Stage 1).

The subsequent process is similar, and the specific working process of each pipelined structure unit is the same as the working process of the first stage to the fifth stage of the first stage of pipeline (Stage 1). The last stage of the 3-bit Flash ADC does not generate a residual output signal, it only needs to perform coarse quantization on the residual amplification output signal $V_{R3}$ of the third stage of pipeline (Stage 3). The quantization of all output codes of the input signal $V_{in(0)}$ is completed as the input signal $V_{in(0)}$ flows through all of the pipeline stages and the last 3 bit Flash ADC, and finally alignment output is performed on the coarse quantized result of each pipeline through the output aligning unit, to obtain a complete signal quantization output result.

In the embodiments of the present disclosure, a pipelined analog-to-digital converter with 12-bit conversion precision realized by using a pipelined analog-to-digital converter technology having input signal pre-comparison and charge redistribution is adopted, and a preferred embodiment of each stage of the pipeline with a coarse quantization accuracy of 3 bits is explained. The pipelined analog-to-digital converter having input signal pre-comparison and charge redistribution can perform multi-bit conversion accuracy as needed. The pipelined analog-to-digital converter with multi-bit conversion precision can be realized by splitting the above embodiment into a multi-stage pipelined structure unit and an output aligning unit, and details will not be described herein.

In summary, the present disclosure combines the highest-bit coarse quantization process of each stage of pipeline of the pipelined analog-to-digital converter with the sample-and-hold process, and the quantization precision is increased by 1 bit in the case where the number of comparators in the sub analog-to-digital converter is the same, thereby reducing the number of stages of the pipelined analog-to-digital converter and reducing overall power consumption with the same conversion precision.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

We claim:

1. A pipelined analog-to-digital converter having input signal pre-comparison and charge redistribution, comprising:
   one-stage or multi-stage pipelined structure unit, wherein each stage of the pipelined structure unit quantizes an input signal;
   a first flash analog-to-digital converter coupled with the pipelined structure unit, for quantizing a residual signal output by a final stage of the pipelined structure unit and outputting a corresponding quantized value; and
   an adjusting output unit coupled with the first flash analog-to-digital converter, for combining each of the quantized values according to a connection order of the multi-stage pipelined structure unit and the flash analog-to-digital converter to output a complete quantization result; wherein
      each stage of the pipelined structure unit at least includes a corresponding sub analog-to-digital converter and a corresponding pre-comparison sub-unit, wherein
         the sub analog-to-digital converter samples and holds the input signal,
         the pre-comparison sub-unit compares the input signal with a corresponding reference voltage, outputs a highest-order quantized value of a current stage, and controls a switching state of a selection switch of a reference level in the sub analog-to-digital converter according to the highest-order quantized value, and the sub analog-to-digital converter further coarsely quantizes a sampled input signal to output a corresponding quantized value according to the highest-order quantized value and the switching state of the reference level.

2. The pipelined analog-to-digital converter as in claim 1, wherein the pre-comparison sub-unit comprises a comparator, a pre-comparison switch, a reference voltage, and a reference level selector, wherein a positive input end of the comparator is connected with the pre-comparison switch for receiving the input signal;

a negative input end of the comparator is connected with the reference voltage;

an output end of the comparator is respectively connected with the reference level selector and the sub analog-to-digital converter, latches under control of a clock signal $\phi_{sp}$ and outputs the highest-order quantized value; and the reference level selector controls a state of the selection switch of the reference level in the sub analog-to-digital converter according to the highest-order quantized value.

3. The pipelined analog-to-digital converter as in claim 1, wherein the sub analog-to-digital converter comprises a plurality of one-bit quantization modules and coding modules, wherein output ends of the plurality of quantization modules are sequentially connected with input ends of the coding modules;

the input ends of the coding modules are further connected with the an output end of the pre-comparison sub-unit; and the coding module obtains a corresponding quantized value according to the highest-order quantized value of the pre-comparison sub-unit and an output value of the quantization module.

4. The pipelined analog-to-digital converter as in claim 3, wherein each of the quantization modules comprises a first sampling network, a second flash analog-to-digital converter, a first reference level generator, a first reference level selection switch and a second reference level selection switch, wherein one end of the first sampling network is connected for receiving the input signal, and the other end of the first sampling network is connected with an input end of the second flash analog-to-digital converter;

one end of the first reference level selection switch and one end of the second reference level selection switch are respectively connected between the second flash analog-to-digital converter and the first sampling network, the other end of the first reference level selection switch and the other end of the second reference level selection switch are respectively connected with an output end of the first reference level generator to output a corresponding reference level; and another input end of the second flash analog-to-digital converter is grounded, and an output end of the second flash analog-to-digital converter outputs a corresponding quantized value under control of a clock signal $\phi_c$.

5. The pipelined analog-to-digital converter as in claim 1, wherein each stage of the pipelined structure unit further comprises a sample-and-hold & digital-to-analog sub-unit, and a residual signal negative feedback amplification sub-unit, wherein the sample-and-hold & digital-to-analog sub-unit samples and holds the input signal, and outputs a matched level value according to a quantized value of a current stage of the sub analog-to-digital converter; and the residual signal negative feedback amplification sub-unit redistributes charges corresponding to the level value and outputs a residual signal.

6. The pipelined analog-to-digital converter as in claim 5, wherein the sample-and-hold & digital-to-analog sub-unit includes a second sampling switch, a second sampling capacitor, a second lower board sampling switch, and a second reference level generator, wherein one end of the second sampling switch is connected for receiving the input signal, the other end of the second sampling switch is connected with the second sampling capacitor;

an output end of the second reference level generator is connected between a lower board of the second sampling capacitor and the second sampling switch;

the second reference level generator generates a reference voltage according to a current quantized value of the sub analog-to-digital converter under control of a clock signal $\phi_{qs}$; and an upper board of the second sampling capacitor is connected with a grounded second lower board sampling switch.

7. The pipelined analog-to-digital converter as in claim 6, wherein the residual signal negative feedback amplification sub-unit comprises a residual amplifier input signal switch, a residual signal amplification switch, a first reset switch, a second reset switch, a residual amplifier input signal holding capacitor, a negative feedback capacitor and a residual amplifier, wherein one end of a residual signal generating switch is connected with an output end of the sample-and-hold & digital-to-analog sub-unit, and the other end of the residual signal generating switch is respectively connected with a negative input end of the residual amplifier, one end of the first reset switch, one end of the residual signal amplification switch, and one end of the residual amplifier input signal holding capacitor, wherein the other end of the residual amplifier input signal holding capacitor and the other end of the first reset switch are grounded;

a positive input end of the residual amplifier is grounded, an output end of the residual amplifier outputs a residual signal, the output end of the residual amplifier is fed back to the other end of the residual signal amplification switch through a negative feedback capacitor; and one end of the second reset switch is connected with an output residual signal, and the other end of the second reset switch is grounded.

8. The pipelined analog-to-digital converter as in claim 7, wherein sample-and-hold processes of the sub analog-to-digital converter and the sample-and-hold & digital-to-analog sub-unit in each stage of the pipelined structure unit are synchronized with a residual signal amplification process of a residual signal negative feedback amplification sub-unit and operate independently.

9. The pipelined analog-to-digital converter as in claim 7, wherein a relationship between the second sampling capacitor $C_s$ in the sample-and-hold & digital-to-analog sub-unit, the residual amplifier input signal holding capacitor $C_c$ and the negative feedback capacitor $C_f$ in a residual amplification circuit is: $C_f=(C_s \cdot C_c)/(A_{closeloop} \cdot (C_s+C_c))$, wherein $A_{closeloop}$ indicates a closed-loop amplification factor of the residual amplification circuit, a feedback factor of a residual signal negative feedback amplification circuit is $(C_f(C_s+C_c))/(C_s C_c)$, and sizes of the second sampling capacitor $C_s$ and the residual amplifier input signal holding capacitor $C_c$ are selected to control a magnitude of a negative feedback factor.

10. The pipelined analog-to-digital converter as in claim 5, wherein the sub analog-to-digital converter is scaled with a sampling network in the sample-and-hold & digital-to-analog sub-unit, and the sampling network has a same time constant.

* * * * *